(12) United States Patent
Chu et al.

(10) Patent No.: US 11,158,659 B2
(45) Date of Patent: Oct. 26, 2021

(54) SEMICONDUCTOR DEVICE STRUCTURE WITH ANTI-ACID LAYER AND METHOD FOR FORMING THE SAME

(71) Applicant: Taiwan Semiconductor Manufacturing Co., Ltd., Hsinchu (TW)

(72) Inventors: Yin-Shuo Chu, Taichung (TW); Chi-Chung Yu, Tainan (TW); Li-Yen Fang, Tainan (TW); Tain-Shang Chang, Tainan (TW); Yao-Hsiang Liang, Shinchu (TW); Min-Chih Tsai, Yilan County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 283 days.

(21) Appl. No.: 16/048,780

(22) Filed: Jul. 30, 2018

(65) Prior Publication Data
US 2018/0350855 A1 Dec. 6, 2018

Related U.S. Application Data

(62) Division of application No. 14/970,022, filed on Dec. 15, 2015, now abandoned.

(51) Int. Cl.
*H01L 27/146* (2006.01)
*H01L 21/02* (2006.01)
*H01L 21/8238* (2006.01)

(52) U.S. Cl.
CPC ...... *H01L 27/1462* (2013.01); *H01L 27/1464* (2013.01); *H01L 27/1469* (2013.01); *H01L 27/14621* (2013.01); *H01L 27/14627* (2013.01); *H01L 27/14632* (2013.01); *H01L 27/14636* (2013.01); *H01L 27/14687* (2013.01); *H01L 27/14689* (2013.01); *H01L 27/14612* (2013.01); *H01L 27/14645* (2013.01); *H01L 27/14685* (2013.01); *H01L 27/14698* (2013.01)

(58) Field of Classification Search
CPC .......................... H01L 27/146; H01L 27/1462
See application file for complete search history.

(56) References Cited

U.S. PATENT DOCUMENTS

| 5,514,908 A * | 5/1996 | Liao .................. H01L 21/28518 257/751 |
| 6,087,726 A | 7/2000 | Hsia et al. |
| 6,410,418 B1 | 6/2002 | Yang et al. |

(Continued)

FOREIGN PATENT DOCUMENTS

| JP | 2004296621 | 10/2004 |
| KR | 100732847 | 6/2007 |

*Primary Examiner* — Kenneth Parker
*Assistant Examiner* — Long H Le
(74) *Attorney, Agent, or Firm* — Haynes and Boone, LLP

(57) ABSTRACT

A semiconductor device structure and method for forming the same are provided. The semiconductor device structure includes an interconnect structure formed over a substrate and a passivation layer formed over the interconnect structure. The semiconductor device structure also includes an anti-acid layer formed in the passivation layer and a bonding layer formed on the anti-acid layer and the passivation layer. The anti-acid layer has a thickness that is greater than about 140 nm.

17 Claims, 13 Drawing Sheets

(56) References Cited

U.S. PATENT DOCUMENTS

| | | |
|---|---|---|
| 7,129,161 B2 | 10/2006 | Donohue et al. |
| 7,494,863 B2 | 2/2009 | Han et al. |
| 7,846,830 B2 | 12/2010 | Takewaki et al. |
| 8,067,310 B2 | 11/2011 | Imamura et al. |
| 8,164,126 B2 | 4/2012 | Moon et al. |
| 8,193,555 B2 | 6/2012 | Lin et al. |
| 8,377,733 B2 | 2/2013 | Huang et al. |
| 8,587,077 B2 | 11/2013 | Chen et al. |
| 8,669,602 B2 | 3/2014 | Hayashi et al. |
| 8,837,872 B2 | 9/2014 | Yang et al. |
| 8,848,075 B2 | 9/2014 | Takahashi et al. |
| 9,318,640 B2 | 4/2016 | Hsu et al. |
| 9,359,193 B2 | 6/2016 | Hsieh et al. |
| 9,553,121 B2 | 4/2017 | Sekikawa et al. |
| 9,703,056 B2 | 7/2017 | Neelakantan et al. |
| 2005/0224979 A1* | 10/2005 | Marathe ............ H01L 21/76846 257/758 |
| 2006/0275944 A1 | 12/2006 | Hyun et al. |
| 2010/0136366 A1* | 6/2010 | Sasaoka .................. C23C 26/00 428/632 |
| 2013/0277785 A1* | 10/2013 | Chen ................ H01L 27/14632 257/432 |
| 2014/0042299 A1* | 2/2014 | Wan .................. H01L 27/14609 250/208.1 |
| 2014/0263959 A1* | 9/2014 | Hsu ........................ H01L 31/18 250/208.1 |
| 2015/0076648 A1 | 3/2015 | Yang |
| 2015/0205041 A1* | 7/2015 | Neelakantan ..... H01L 27/14629 385/14 |
| 2015/0357400 A1 | 12/2015 | Furuhashi et al. |
| 2016/0013160 A1* | 1/2016 | Chun .................. H01L 23/3192 257/751 |
| 2017/0117179 A1 | 4/2017 | Koschinsky et al. |

* cited by examiner

SEMICONDUCTOR DEVICE STRUCTURE WITH ANTI-ACID LAYER AND METHOD FOR FORMING THE SAME

CROSS-REFERENCE

This application is a divisional of U.S. patent application Ser. No. 14/970,022, filed Dec. 15, 2015, which is hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

An image sensor is used to convert an optical image focused on the image sensor into an electrical signal. The image sensor includes an array of light-detecting elements, such as photodiodes, and a light-detecting element is configured to produce an electrical signal corresponding to the intensity of light impinging on the light-detecting element. The electrical signal is used to display a corresponding image on a monitor or provide information about the optical image.

Although existing image sensor device structures and methods for forming the same have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
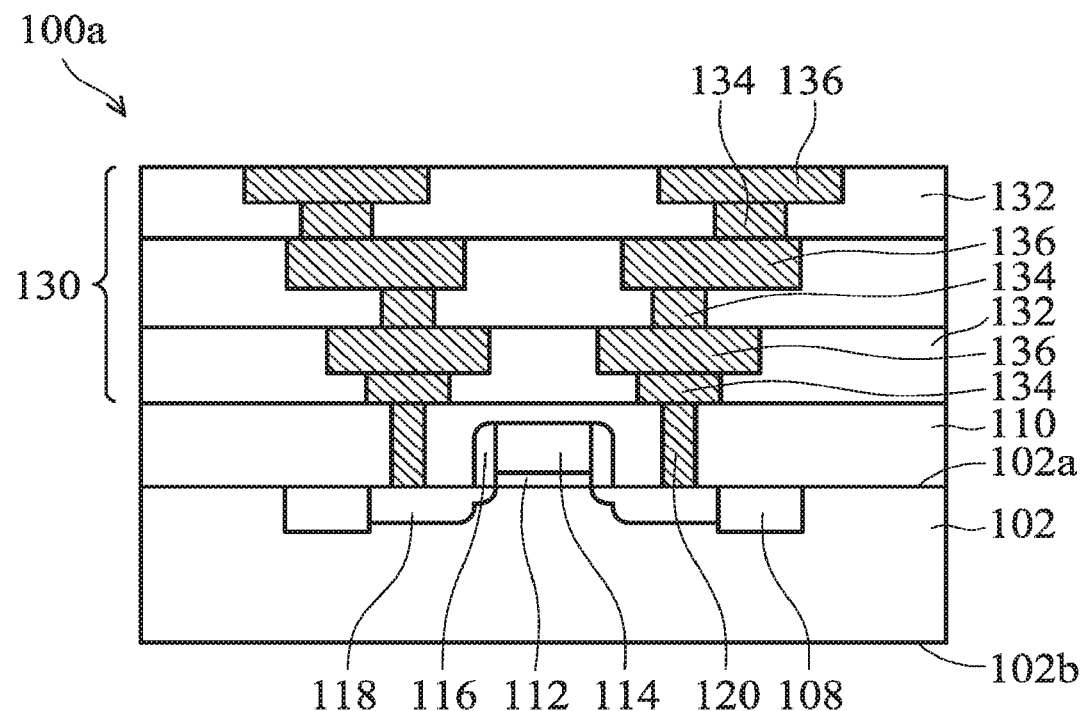
FIGS. 1A-1F show cross-sectional representations of various stages of forming a complementary metal-oxide-semiconductor (CMOS) image sensor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a semiconductor device structure and method for forming the same are provided. FIGS. 1A-1F show cross-sectional representations of various stages of forming a complementary metal-oxide-semiconductor (CMOS) image sensor structure 300a, in accordance with some embodiments of the disclosure. The structure 300a is a backside illuminated (BSI) image sensor structure. FIGS. 2A-2E show perspective representations of various stages of forming a complementary metal-oxide-semiconductor (CMOS) image sensor structure 300a, in accordance with some embodiments of the disclosure Referring to FIG. 1A, a semiconductor device structure 100a includes a substrate 102. In some embodiments, the substrate 102 is a portion of a wafer. The substrate 102 has a frontside 102a and a backside 102b.

The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The substrate 102 may further include isolation features 108, such as shallow trench isolation (STI) features or local oxidation of silicon (LOCOS) features. Isolation features may define and isolate various device elements.

The substrate 102 may further include doped regions (not shown). The doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

A transistor including a gate dielectric layer 112 and a gate electrode layer 114 is formed at the frontside 102a of the substrate 102. The spacers 116 are formed on opposite sidewalls of the gate electrode layer 114. The source/drain (S/D) structures 118 are formed in the substrate 102.

Other device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements may formed over the substrate 102. Various processes are performed to form device elements, such as deposition, etching, implantation, photolithography, annealing, and/or other applicable processes. In some embodiments, device elements are formed in the substrate 102 in a front-end-of-line (FEOL) process.

Afterwards, an inter-layer dielectric (ILD) layer 110 is formed over the frontside 102a of the substrate 102, as shown in FIG. 1A, in accordance with some embodiments of the disclosure. The ILD layer 110 may include multilayers. The ILD layer 110 is made of silicon oxide (SiOx), silicon nitride (SixNy), silicon oxynitride (SiON) or low-k dielectric material, another applicable dielectric material.

A contact structure 120 is formed in the ILD layer 110 and over the S/D structure 118. The contact structure 120 is made of conductive material, such as such as copper (Cu), copper alloy, aluminum (Al), aluminum alloy, tungsten (W), tungsten alloy, titanium (Ti), titanium alloy, tantalum (Ta), tantalum alloy, or another applicable materials.

An interconnect structure 130 is formed over the ILD layer 110. The interconnect structure 130 includes an inter-metal dielectric (IMD) layer 132, a conductive via plug 134, and a conductive line 136. The IMD layer 132 may be a single layer or multiple layers. The conductive via plug 134 and the conductive line 136 are formed in the IMD layer 132. The conductive line 136 is electrically connected to another adjacent conductive line 136 through the conductive via plug 134. The interconnect structure 130 is formed in a back-end-of-line (BEOL) process.

The IMD layer 132 is made of silicon oxide (SiOx), silicon nitride (SixNy), silicon oxynitride (SiON), dielectric material(s) with low dielectric constant (low-k), or combinations thereof. In some embodiments, the IMD layer 132 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide (SiO$_2$). In some embodiments, the IMD layer 132 is deposited by a plasma enhanced chemical vapor deposition (PECVD) process or by a spin coating process.

The conductive via plug 134 and the conductive line 136 are independently made of copper (Cu), copper alloy, aluminum (Al), aluminum alloy, tungsten (W), tungsten alloy, titanium (Ti), titanium alloy, tantalum (Ta) or tantalum alloy. In some embodiments, the conductive via plug 134 and the conductive line 136 are formed by a plating method.

As shown in FIG. 1A, a top surface of the conductive line 136 is level with a top surface of the IMD layer 132. In other words, the conductive line 136 and the IMD layer 132 are coplanar. The metal routings of the conductive features shown in FIG. 1A, are merely examples. Alternatively, other designs of metal routings of conductive features may be used according to actual application.

Figure 2A:
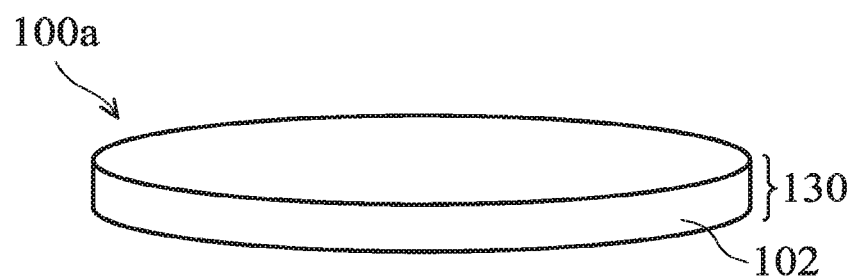
FIGS. 2A-2E show perspective representations of various stages of forming a complementary metal-oxide-semiconductor (CMOS) image sensor structure, in accordance with some embodiments of the disclosure.

FIG. 2A shows a perspective representation of the interconnect structure 130 over the substrate 102, in accordance with some embodiments of the disclosure. The interconnect structure 130 is formed over the frontside 102a of the substrate 102.

Figure 1B:
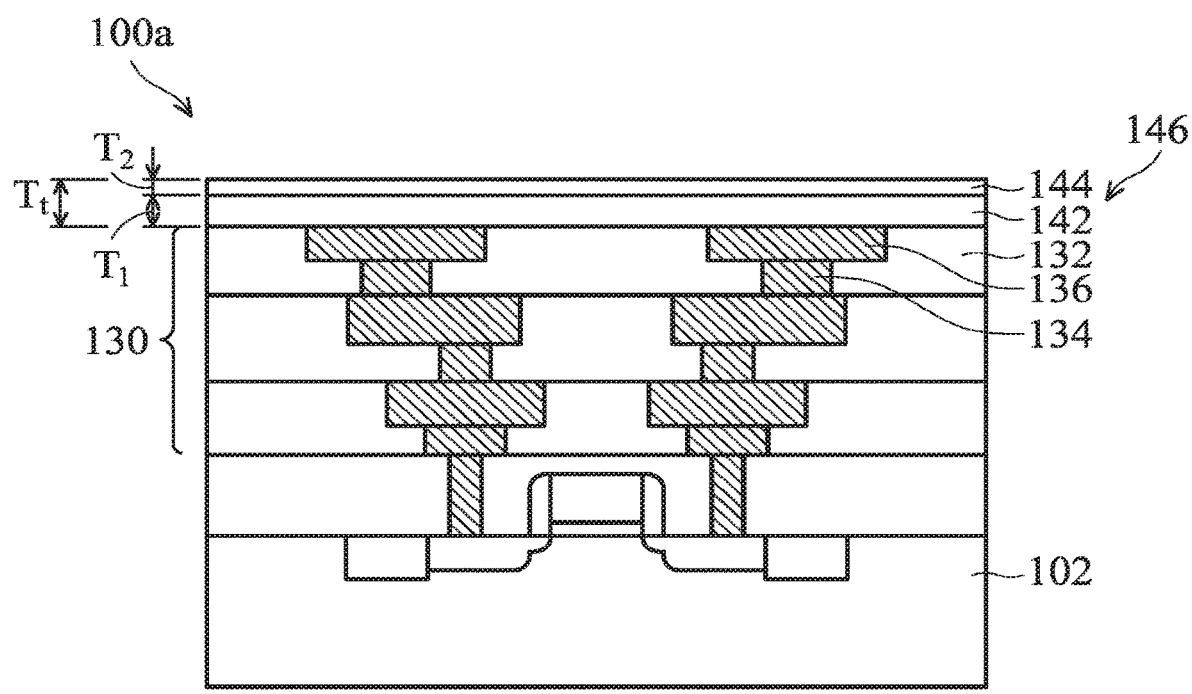

After forming the interconnect structure 130, an anti-acid layer 146 is formed over the top surface of the conductive line 136 and a top surface of the IMD layer 132, as shown in FIG. 1B, in accordance with some embodiments of the disclosure. The anti-acid layer 146 is configured to provide good acid resistance to prevent the acid solution diffusing into the underlying layers. The acid solution may be used in the subsequent process. In some embodiments, the acid solution is used to clean surfaces or removed undesirable contamination.

In some embodiments, the substrate 102 is a portion of a wafer, and the top surface of the wafer is completely covered by the anti-acid layer 146. The top surface of the interconnect structure 130 is completely covered by the anti-acid layer 146. More specifically, no passivation layer is formed between the top surface of the interconnect structure 130 and a bottom surface of the anti-acid layer 146. The anti-acid layer 146 includes a metal nitride layer 142 and a metal layer 144. The metal nitride layer 142 is in direct contact with the top surface of the interconnect structure 130. The metal nitride layer 142 includes a metal element that is the same as that of the metal layer 144. In some embodiments, the metal nitride layer 142 is tantalum nitride (TaN), and the metal layer 144 is tantalum (Ta). In some embodiments, the tantalum (Ta) is β phase tantalum (Ta). The β phase tantalum (Ta) have higher corrosion resistance than α phase. In some other embodiments, the metal nitride layer 142 is titanium nitride (TiN), and the metal layer 144 is titanium (Ti).

In some embodiments, the metal nitride layer 142 is made of a physical vapor deposition (PVD) process. In some embodiments, the PVD process is performed by using nitrogen (N$_2$) and argon (Ar) gas. In some embodiments, the nitrogen gas has a flow rate in a range from about 20 sccm to about 100 sccm. In some embodiments, a ratio of the flow rate of the nitrogen gas to the flow rate of the argon (Ar) gas is in a range from about 0.2 to 1 If the flow rate of the nitrogen gas is smaller than 20 sccm or the ratio smaller than 0.2, the diffusion barrier properties may be poor. If the flow rate of the nitrogen gas is larger than 100 sccm or the ratio larger than 1, formation of the metal nitride layer may become difficult.

In some embodiments, the metal nitride layer 142 has a first thickness $T_1$ in a range from about 5 nm to about 10 nm. In some embodiments, the metal nitride layer 142 has a second thickness $T_2$ in a range from about 135 nm to about 240 nm. The thickness $T_1$ of the anti-acid layer 146 is the sum of the first thickness $T_1$ and the second thickness $T_2$. In some embodiments, the thickness $T_t$ of the anti-acid layer 146 is in a range from about 140 nm to about 250 nm. If the thickness $T_t$ is smaller than 140 nm, the anti-acid ability or acid resistant properties may be poor, and therefore the underlying layers may be etched. If the thickness $T_t$ of the anti-acid layer 146 is greater than 250 nm, the risk of the contamination may increase because the deposition time is too long. Furthermore, the fabricating time and cost are increased.

Furthermore, the anti-acid layer 146 is configured to be used as a diffusion barrier layer. The diffusion barrier layer is used to prevent the bonding layer 150, which will be formed later, from migrating to underlying layers.

It should be noted that, in some other embodiments, if a diffusion barrier layer below a conductive structure has a thickness smaller than 140 nm, the thickness may be enough to form a barrier against the migration of the conductive material, but it is too thin to prevent the underlying layers from being etched by the acid solution. The acid solution may easily penetrate through the thin diffusion barrier layer.

Therefore, in order to have good acid-resistant properties, the anti-acid layer 146 including metal nitride layer 142 and the metal layer 144 with a thickness $T_t$ larger than 140 nm is provided.

Figure 2B:
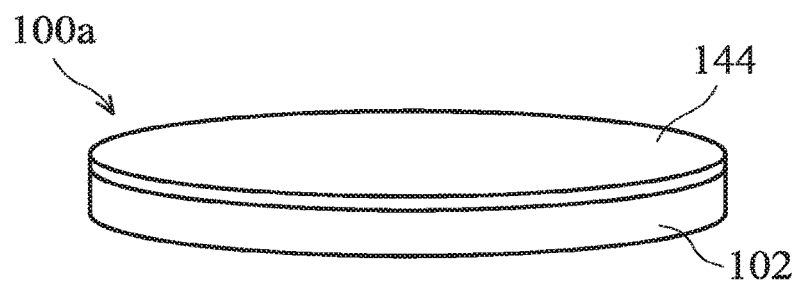

FIG. 2B shows a perspective representation of the anti-acid layer 146 over the substrate 102, in accordance with some embodiments of the disclosure. More specifically, the metal layer 144 covers all top surface of the substrate 102.

Figure 1C:
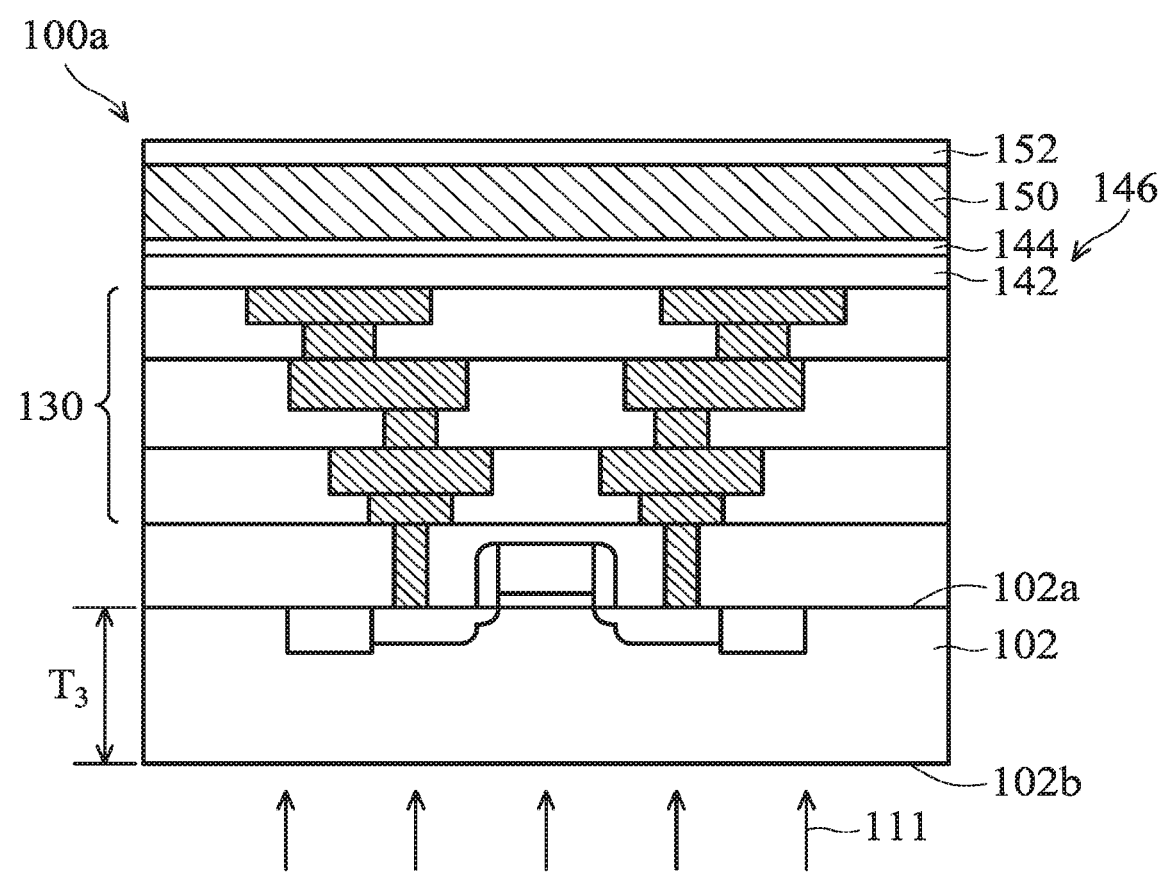

After forming the anti-acid layer 146, the bonding layer 150 is formed over the anti-acid layer 146, as shown in FIG. 1C, in accordance with some embodiments of the disclosure. The bonding layer 150 is configured to electrically connect to other layers.

The bonding layer 150 is made of conductive material. In some embodiments, the bonding layer 150 is made of aluminum copper (AlCu) alloy, and the aluminum copper alloy containing 95% to 99.5% aluminum and 0.5% to 5% copper. In some other embodiments, the bonding layer 150 is made of aluminum (Al), titanium (Ti), tantalum (Ta), copper (Cu), tungsten (W), alloy thereof. In some embodiments, the bonding layer 150 is formed by a deposition process, such as chemical vapor deposition (CVD), physical vapor deposition (PVD), plating, another applicable process or the like.

In some embodiments, the bonding layer 150 has a thickness in a range from about 1200 nm to about 1500 nm. In some embodiments, a ratio of the anti-acid layer 146 to the bonding layer 150 is in a range from about 4 to about 11. When the ratio is within the above-mentioned range, the anti-acid property is improved.

It should be noted that after the bonding layer 150 is formed, a quality test is performed on the semiconductor device structure 100a. In some embodiments, the quality test includes a bonding ability test and anti-acid test. After forming the bonding layer 150, the bonding ability test is performed to check if the bonding layer can resist a high force. After the bonding ability test, the bonding layer 150 will be removed to continue the following anti-acid test. The anti-acid layer 146 is exposed to an acid solution. The anti-acid test is used to test if the conductive via plug 134 and the conductive line 136 will be etched by the acid solution or not. In some embodiments, the acid solution is aqua regia (also called "king's water") which is formed by mixing concentrated nitric acid ($HNO_3$) and hydrochloric acid (HCl), in a volume ratio of 1:3.

If the thickness of the anti-acid layer 146 is not thick enough, the acid solution may pass or penetrate through the anti-acid layer 146 and etch a portion of the conductive via plug 134 and the conductive line 136. By forming the anti-acid layer 146 with a greater thickness Tt than 140 nm, the semiconductor device structure 100a passes the anti-acid test. Therefore, the anti-acid layer 146 protects the underlying layers from being etched. In addition, the reliability of the semiconductor device structure 100a is further increased.

It should be noted that normal quality test does not include the anti-acid test, it may be not needed to control the thickness of the anti-acid layer. However, in some embodiments, the anti-acid test is needed to ensure the quality of the anti-acid layer 146. Therefore, in order to pass the anti-acid test, the thickness of the anti-acid layer 146 of the disclosure should be well controlled to equal to or greater than 140 nm. If the thickness of the anti-acid layer 146 is smaller than 140 nm, the underlying layer may be etched and delaminated easily.

It should be noted that the anti-acid layer 146 and the bonding layer 150 are sequentially performed at the same CMP station. In other words, the deposition processes are performed in-situ without being transported to another station for convenience and efficiency.

A protecting layer 152 is formed over the bonding layer 150 to temporarily protect the bonding layer 150 during transferring the semiconductor device structure 100a. When the protecting layer 152 is formed, the semiconductor device structure 100a is removed from the chamber and ready for bonding. The protecting layer 152 is made of inert metal material. In some embodiments, the protecting layer 152 is made of tantalum (Ta), titanium (Ti), iron (Fe), copper (Cu) or a combination thereof.

Before bonding process, the protecting layer 152 is replaced by a passivation layer 154. In some embodiments, the passivation layer 154 is made of non-organic materials, such as silicon oxide, un-doped silicate glass, silicon oxynitride, solder resist (SR), silicon nitride, HMDS (hexamethyldisilazane). In some other embodiments, the passivation layer 154 is made of a polymer material, such as polyimide (PI), epoxy, or fluorine (F)-containing polymer.

Afterwards, a planarizing process is performed on the backside 102 of the substrate 102 to thin the backside 102b of the substrate 102, as shown in FIG. 1C, in accordance with some embodiments of the disclosure. In some embodiments, the planarizing process is a chemical mechanical polishing (CMP) process. The planarizing process is configured to decrease the height of the semiconductor device structure 100a.

Figure 2C:
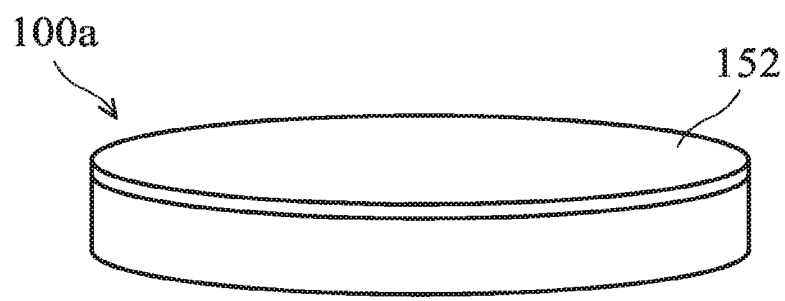

FIG. 2C shows a perspective representation of the protecting layer 152 over the frontside 102a of the substrate 102, in accordance with some embodiments of the disclosure. More specifically, the protecting layer 152 is formed over the bonding layer 150. The top surface of the bonding layer 150 is completely covered by the protecting layer 152.

After the palarizing process, the substrate 102 has a fourth thickness $T_4$ (shown in FIG. 1D) which is smaller than the third thickness $T_3$ (shown in FIG. 1C).

Figure 1D:
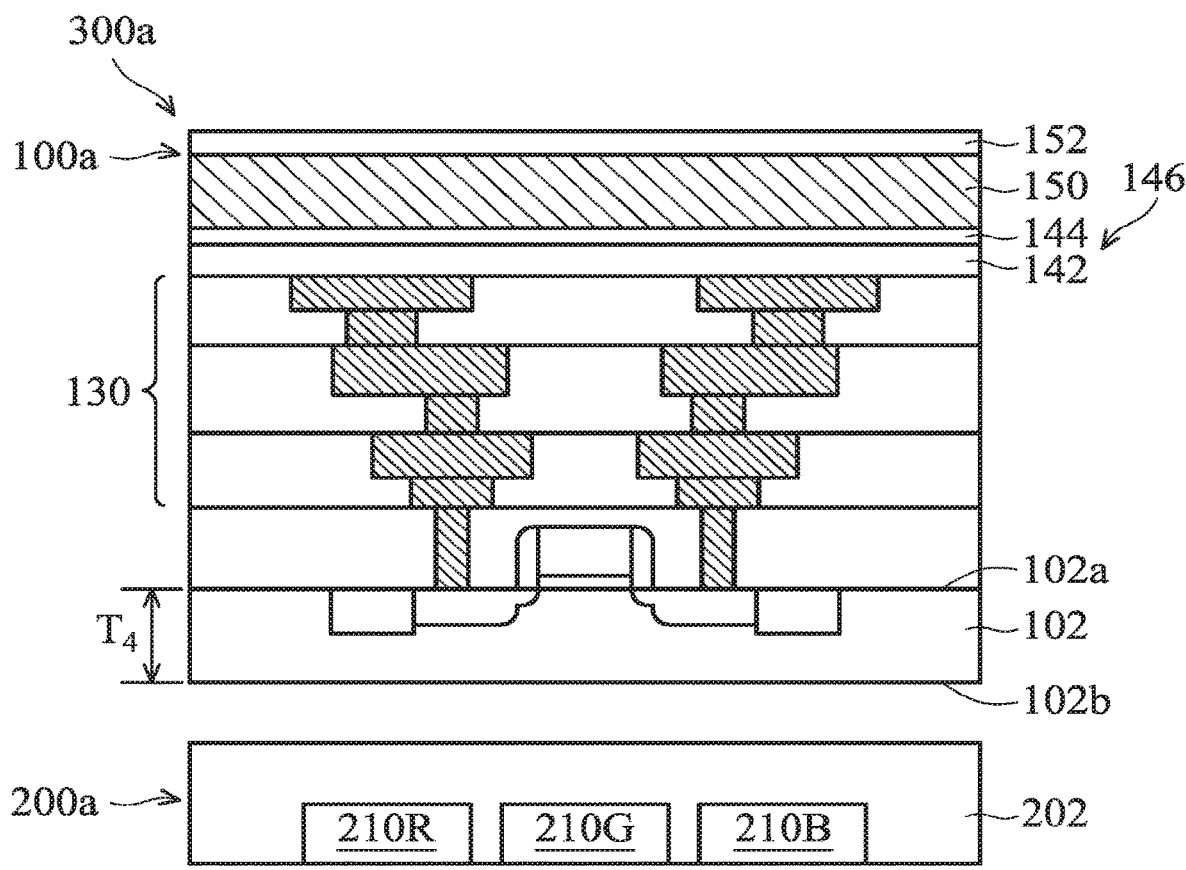

Afterwards, an image sensor device structure 200a is prepared, as shown in FIG. 1D, in accordance with some embodiments of the disclosure. The image sensor device structure 200a includes a substrate 202. A number of pixel regions 210 are formed in the substrate 202. In some embodiments, the image sensor device structure 200a is free from, or substantially free from, logic devices (such as logic transistors).

The pixel regions 210 may include pixels 210R, 210G and 210B corresponding to specific wavelengths. For example, the pixels 210R, 210G and 210B respectively correspond to a range of wavelengths of red light, green light and blue light. Therefore, each of the pixels 210R, 210G and 210B may detect the intensity (brightness) of a respective range of wavelengths. The term "pixel" refers to a unit cell containing features (for example, circuitry including a photodetector and various semiconductor devices) for converting electromagnetic radiation into electrical signals. In some embodiments, the pixels 210R, 210G and 210B are photodetectors, such as photodiodes including light-sensing regions. The light-sensing regions may be doped regions having n-type and/or p-type dopants formed in device substrate 102. The light-sensing regions may be formed by an ion implantation process, diffusion process, or other applicable processes.

Figure 2D:
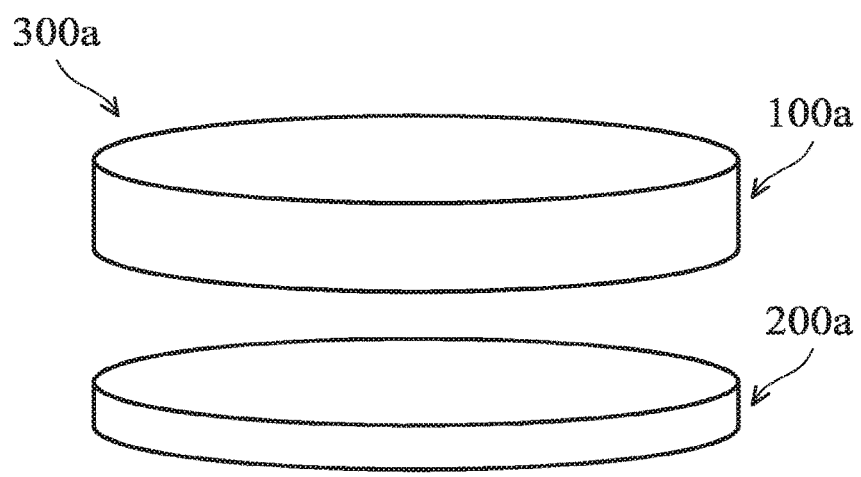

FIG. 2D shows a perspective representation of the semiconductor device structure 100a and the image sensor device structure 200a before performing a bonding process, in accordance with some embodiments of the disclosure. The backside 102b of the substrate 102 faces the top surface of the substrate 202 before the bonding process.

Figure 1E:
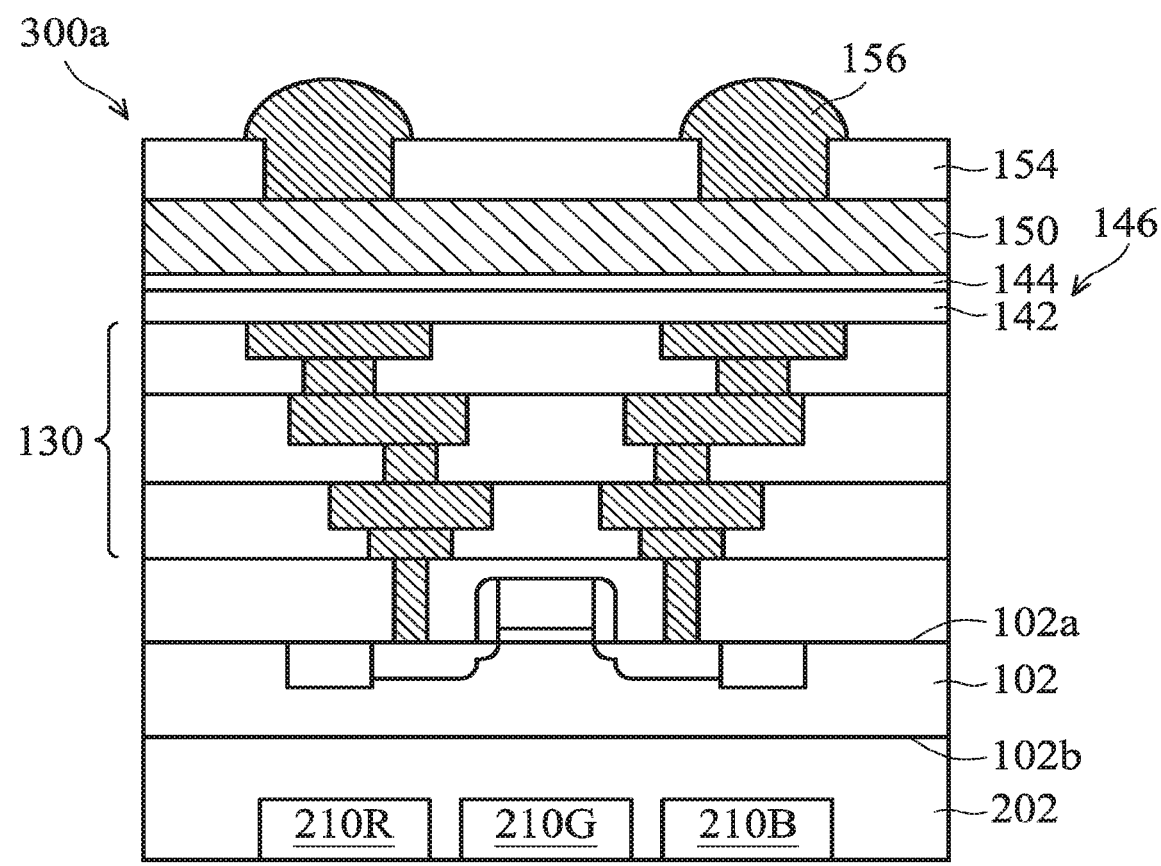

Afterwards, the semiconductor device structure 100a and the image sensor device structure 200a are bonded together to form a 3DIC stacking structure 300a, as shown in FIG. 1E, in accordance with some embodiments of the disclosure. In some embodiments, the substrate 102 and the substrate 202 both are made of silicon, and a bonding process for bonding of the substrate 102 and the substrate 202 is performed under pressure and heat.

Afterwards, in some embodiments, a number of openings (not shown) are formed in the passivation layer 154, and the conductive bump structure 156 is formed in the openings. The conductive bump structure 156 is electrically connected to the bonding layer 150.

Figure 2E:
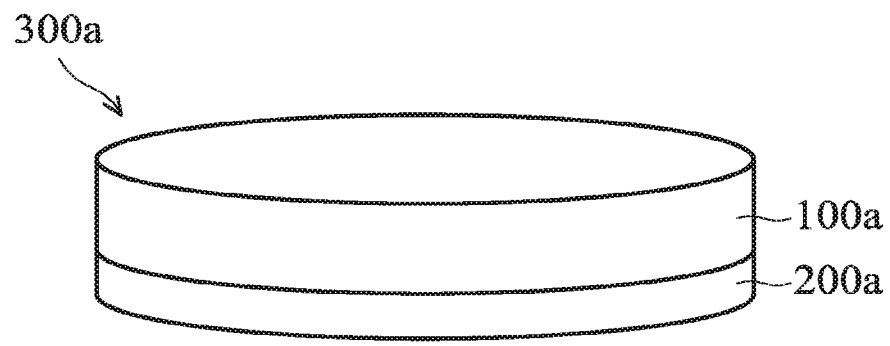

FIG. 2E shows a perspective representation of the semiconductor device structure 100a and the image sensor device structure 200a after the bonding process, in accordance with some embodiments of the disclosure. The 3DIC stacking structure 300a includes the semiconductor device structure 100a and the image sensor device structure 200a. The pixels 210R, 210G and 210B are formed below the backside 102b of the substrate 102.

Figure 1F:
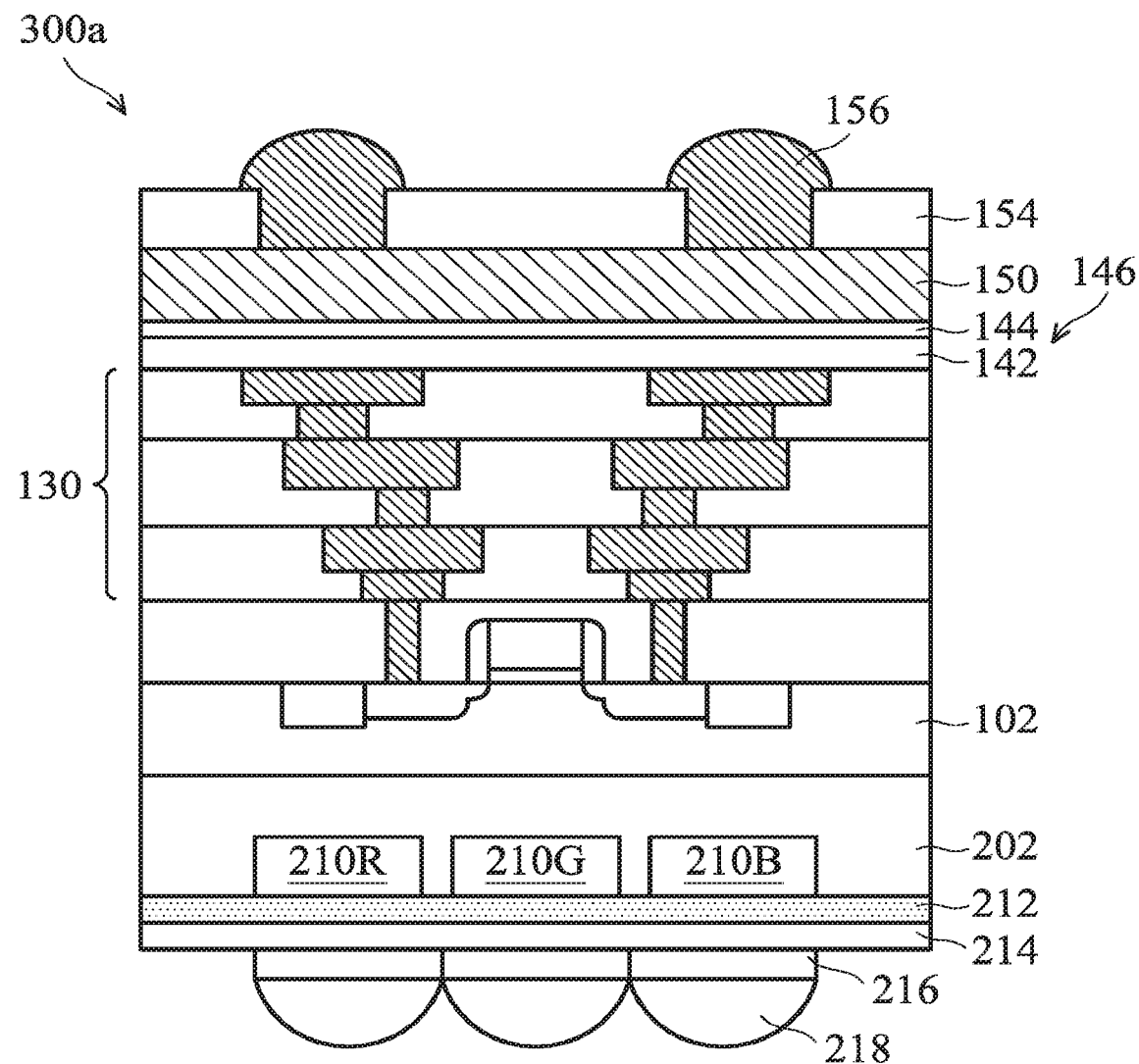

Afterwards, a doped layer 212 is formed over the exposed pixels 210R, 210G and 210B as shown in FIG. 1F, in accordance with some embodiments of the disclosure. In some embodiments, the doped layer 212 is formed directly on the pixels 210R, 210G and 210B. The doped layer 212 is formed over the backside 102b of the substrate 102. The doped layer 212 is configured to improve the image quality of the image sensor. In some embodiments, the doped layer 212 is doped with p-type dopants, such as boron or $BF_2$, and/or n-type dopants, such as phosphorus (P) or arsenic (As).

Afterwards, an antireflection layer 214 is formed over the doped layer 212. The antireflection layer 214 is made of dielectric materials, such as silicon nitride, silicon oxynitride, or anther applicable material.

Next, a color filter layer 216 is formed over the antireflection layer 214. The incident light may be filtered by the color filter layer 216 and the filtered incident light, such as being transformed into red light, may reach the pixels 210R, 210G and 210B.

In some embodiments, the color filter layer 216 is made of a dye-based (or pigment-based) polymer for filtering out a specific frequency band. In some embodiments, the color filter layer 216 is made of a resin or other organic-based materials having color pigments.

Afterwards, a microlens layer 218 is formed over the color filter layer 216. Each of the microlenses is aligned with one of the corresponding color filter layers 216, and therefore is aligned with one of the corresponding pixels 210R, 210G and 210B. However, it should be noted that microlenses may be arranged in various positions in various applications.

Therefore, the CMOS image sensor structure 300a is obtained. The anti-acid layer 146 is formed over the backside 102b of the substrate 102. In other words, the anti-acid layer 146 is formed above the pixels 210R, 210G and 210B. The anti-acid layer 146 with a thickness that is greater than 140 nm has good acid resistant properties.

FIGS. 3A-3D show cross-sectional representations of various stages of forming a complementary metal-oxide-semiconductor (CMOS) image sensor structure 300b, in accordance with some embodiments of the disclosure. The structure 300b is a frontside illuminated (BSI) image sensor structure.

Figure 3A:
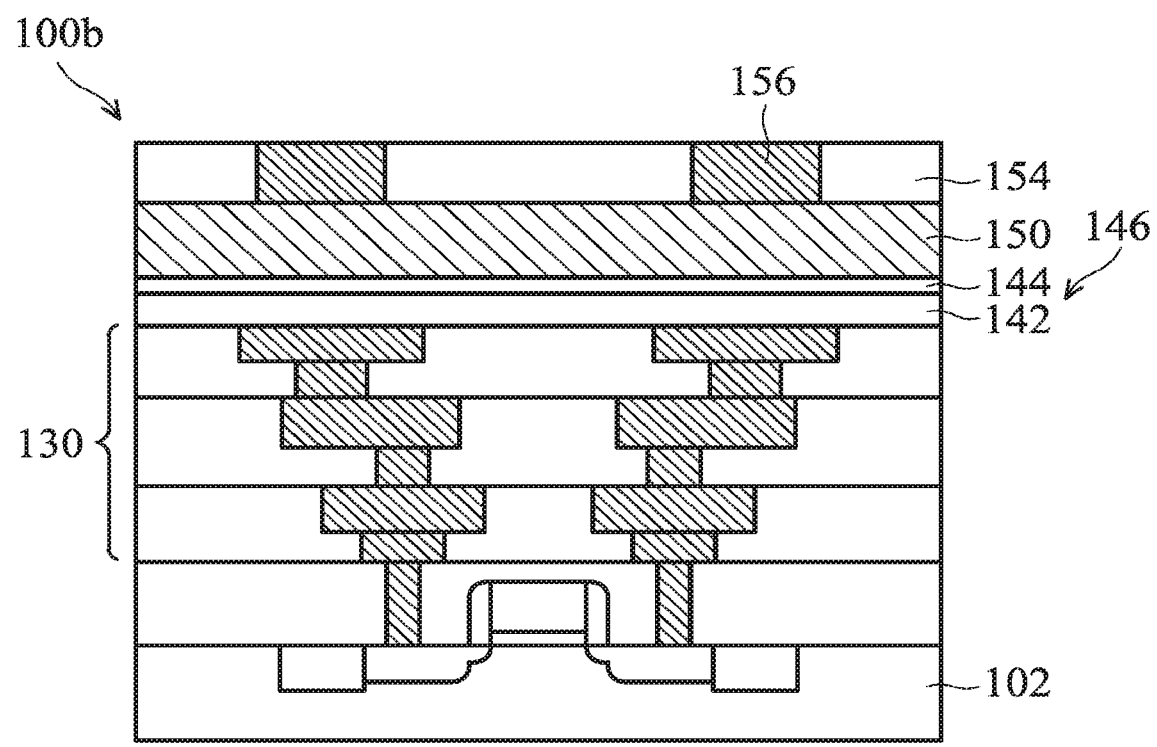
FIGS. 3A-3D show cross-sectional representations of various stages of forming a complementary metal-oxide-semiconductor (CMOS) image sensor structure, in accordance with some embodiments of the disclosure.

The semiconductor device structure 100b shown in FIG. 3A is similar to, or the same as, the semiconductor device structure 100a shown in FIG. 1C, except a conductive structure 156 is formed in the passivation layer 154. The top surface of the conductive structure 156 is level with the top surface of the passivation layer 154.

Figure 3B:
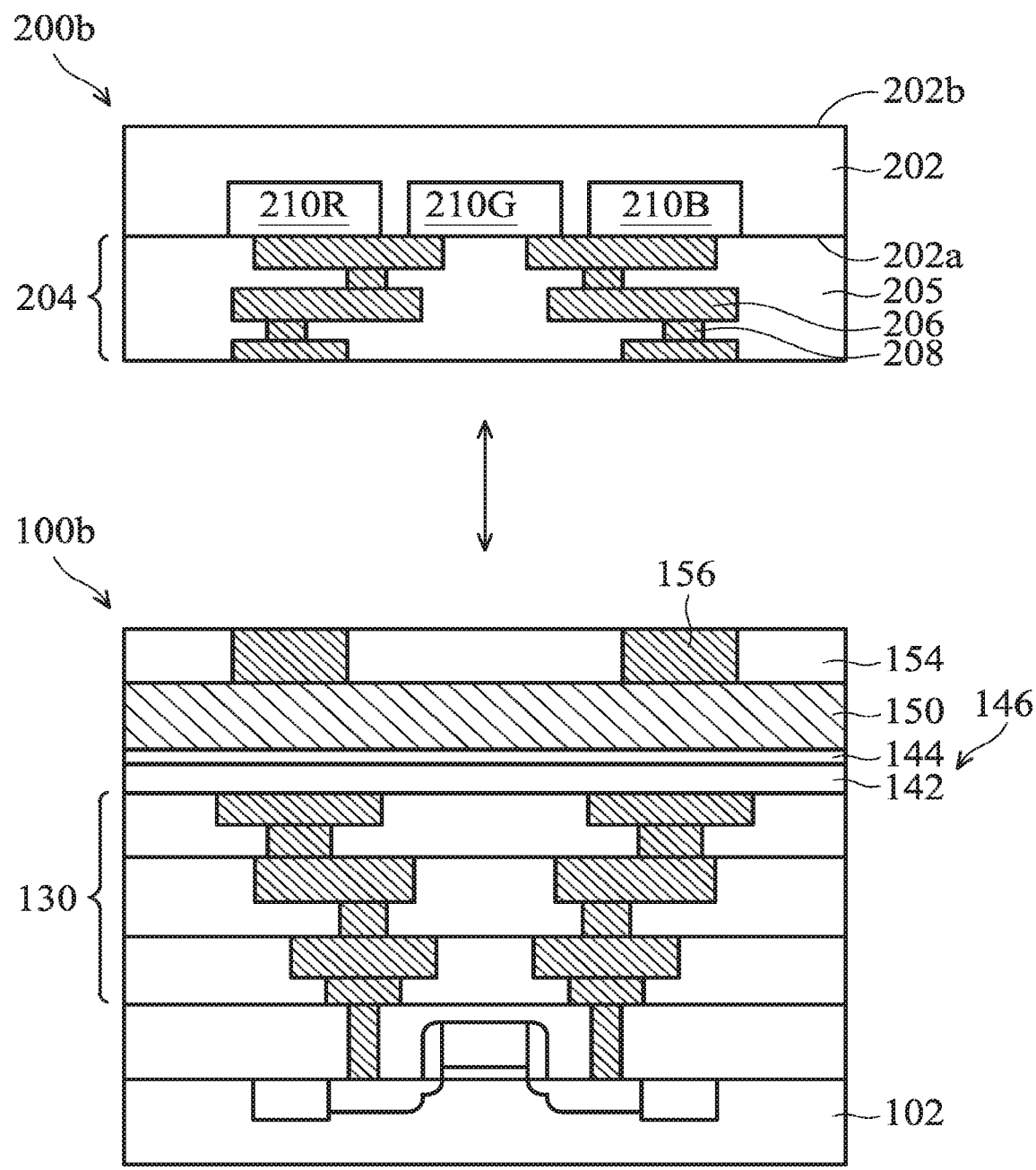

Afterwards, an image sensor device structure 200b is prepared, as shown in FIG. 3B, in accordance with some embodiments of the disclosure. The image sensor device structure 200b includes pixels 210R, 210G and 210B formed in the substrate 202. The substrate 202 includes a frontside 202a and a backside 202b. An interconnect structure 204 formed over the frontside 202a of the substrate 202. The interconnect structure 204 includes an inter-metal dielectric (IMD) layer 205, a conductive line 206 and a conductive via plug 208. The conductive line 206 and the conductive via plug 208 are formed in the IMD layer 205.

Figure 3C:
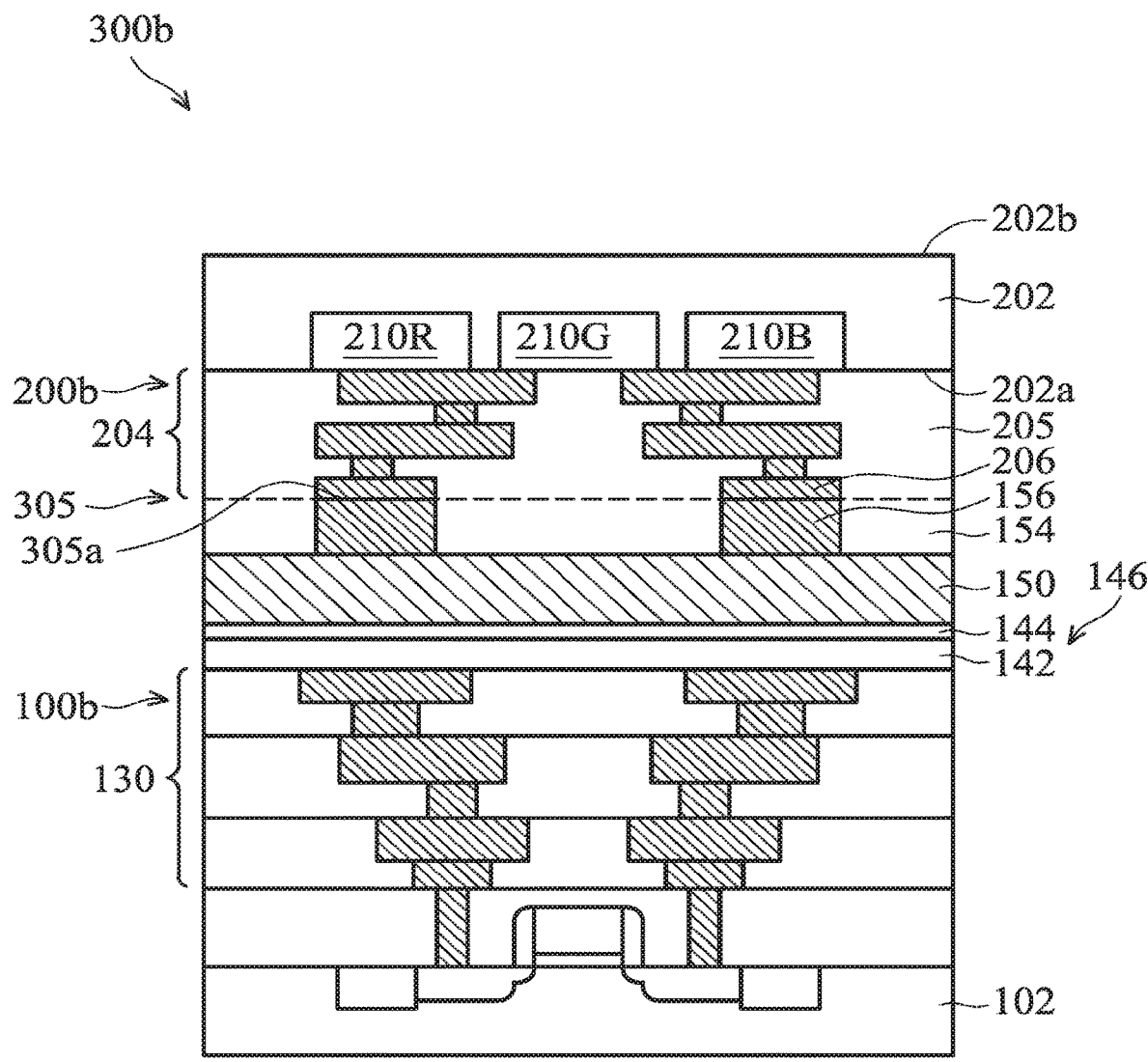

Afterwards, the semiconductor device structure 100b and the image sensor device structure 200b are bonded together by hybrid bonding to form a 3DIC stacking structure 300b, as shown in FIG. 3C, in accordance with some embodiments of the disclosure.

The hybrid bonding involves at least two types of bonding, including metal-to-metal bonding and non-metal-to-non-metal bonding. As shown in FIG. 3C, a hybrid bonding structure 305 is formed between the semiconductor device structure 100b and the image sensor device structure 200b. The hybrid bonding structure 305 includes the conductive bump structure 156 and the conductive line 206 bonded by metal-to-metal bonding and the passivation layer 154 and the IMD layer 205 bonded by non-metal-to-non-metal bonding. In some embodiments, the hybrid bonding may be performed in an inert environment, such as an environment filled with inert gas including $N_2$, Ar, He, or combinations thereof.

As shown in FIG. 3C, the bonding structure 305 has a metallic bonding interface 305a between the conductive bump structure 156 and the conductive line 206 but may not have a clear non-metallic interface between the passivation layer 154 and the IMD layer 205 due to the reflow process.

Figure 3D:
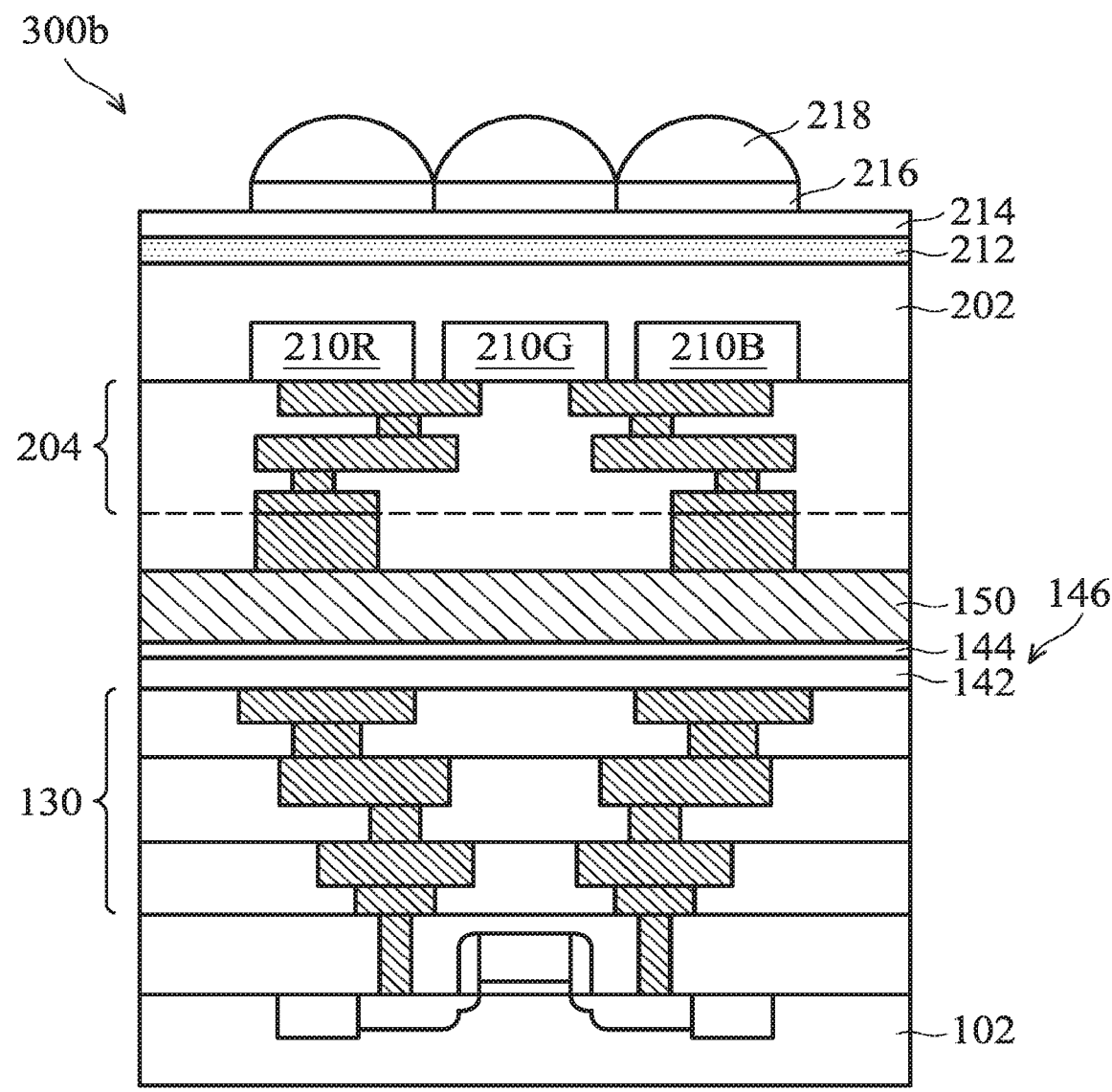

Afterwards, a doped layer 212 is formed over the exposed pixels 210R, 210G and 210B as shown in FIG. 3D, in accordance with some embodiments of the disclosure. The doped layer 212 is formed over the backside 202b of the substrate 202 The doped layer 212 is configured to improve the image quality of the image sensor.

Afterwards, the antireflection layer 214 is formed over the doped layer 212. Next, the color filter layer 216 is formed over the antireflection layer 214. The incident light may be filtered by the color filter layer 216 and the filtered incident light, such as being transformed into red light, may reach the pixels 210R, 210G and 210B.

Afterwards, the microlens layer 218 is formed over the color filter layer 216. The microlens layer 218 is aligned with one of the corresponding color filter layers 216, and therefore is aligned with one of the corresponding pixels 210R, 210G and 210B.

Therefore, the CMOS image sensor structure 300b is obtained. The anti-acid layer 146 is formed over the frontside 102a of the substrate 102. In other words, the anti-acid layer 146 is formed below the pixels 210R, 210G and 210B. The anti-acid layer 146 with a thickness that is greater than 140 nm has good acid resistant properties. Therefore, the reliability of the CMOS image sensor structure 300b is improved.

FIGS. 4A-4E show cross-sectional representations of various stages of forming a semiconductor device structure 100c, in accordance with some embodiments of the disclosure. The semiconductor device structure 100c is similar to, or the same as, the semiconductor device structure 100a shown in FIG. 1A, except a passivation layer 160 is formed over the interconnect structure 130. Processes and materials used to form a semiconductor device structure 100c may be similar to, or the same as, those used to form the semiconductor device structure 100a and are not repeated herein.

Figure 4A:
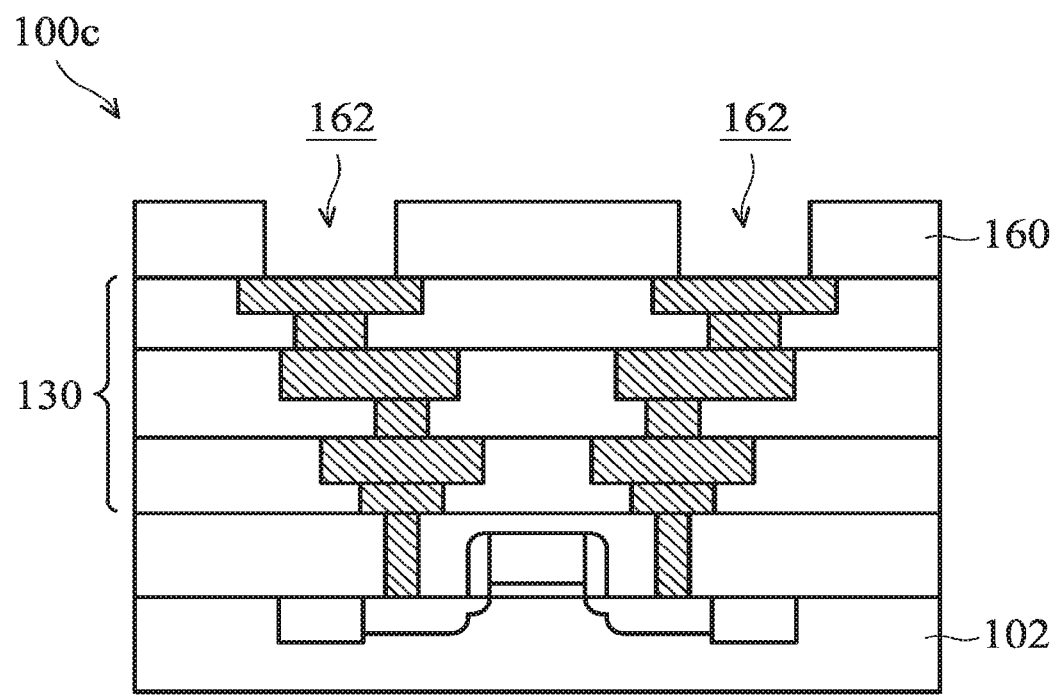
FIGS. 4A-4E show cross-sectional representations of various stages of forming a semiconductor device structure, in accordance with some embodiments of the disclosure.

As shown in FIG. 4A, the passivation layer 160 is formed over the interconnect structure 130, and openings 162 are formed in the passivation layer 160. The openings 162 are formed by a patterning process.

Figure 4B:
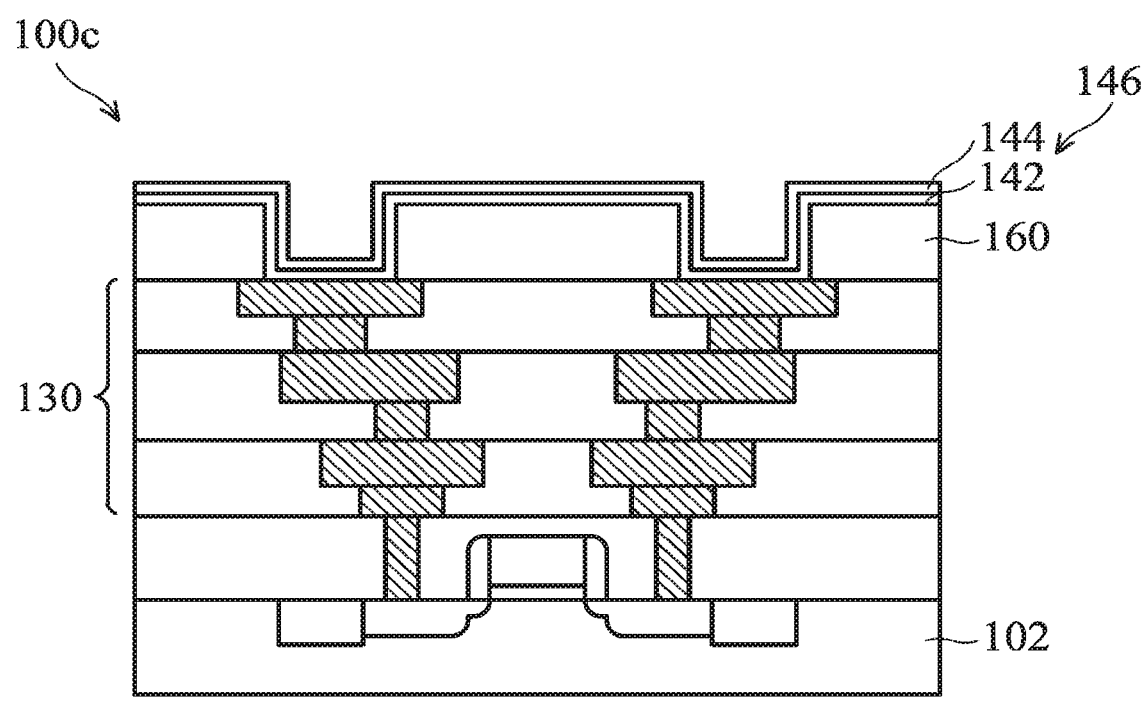

After forming the openings 162, a metal nitride layer 142 and a metal layer 144 are sequentially formed in the openings 162 and over the passivation layer 160, as shown in FIG. 4B, in accordance with some embodiments of the disclosure.

The metal nitride layer 142 is conformally formed on the bottom and sidewall of the openings 162. The metal nitride layer 142 and the metal layer 144 are collectively named as an anti-acid layer 146. The anti-acid layer 146 is used to prevent the underlying layer from being corroded in the subsequent process.

The metal nitride layer 142 includes a metal element that is the same as that of the metal layer 144. In some embodiments, the metal nitride layer 142 is tantalum nitride (TaN), and the metal layer 144 is tantalum (Ta). In some other embodiments, the metal nitride layer 142 is titanium nitride (TiN), and the metal layer 144 is titanium (Ti).

Figure 4C:
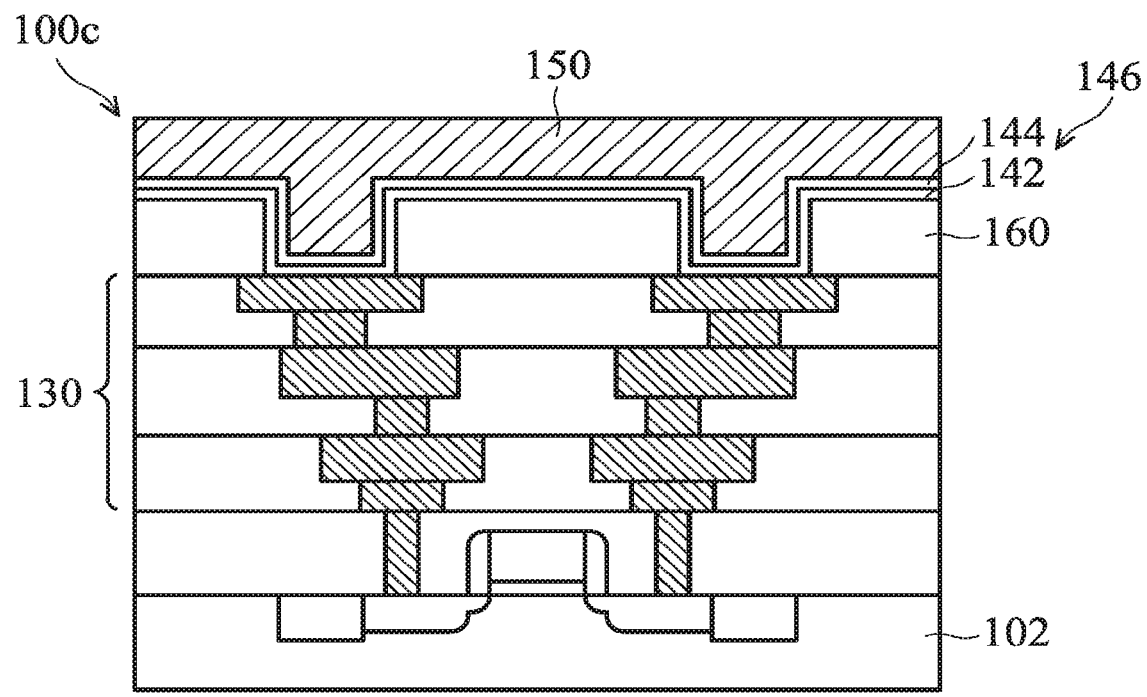

After forming the metal layer 144, the bonding layer 150 is formed in the openings 162 and on the metal layer 144, as shown in FIG. 4C, in accordance with some embodiments of the disclosure. In some embodiments, the bonding layer 150 is made of AlCu alloy.

Figure 4D:
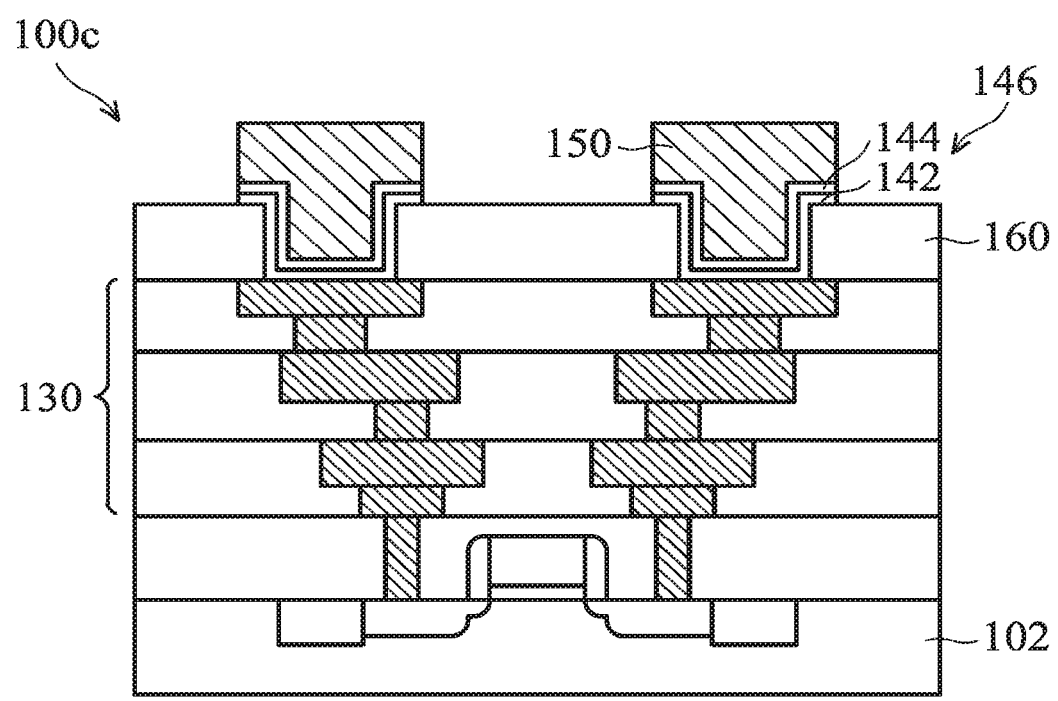

Afterwards, the metal nitride layer 142, the metal layer 144 and the bonding layer 150 are patterned, as shown in FIG. 4D, in accordance with some embodiments of the disclosure.

Figure 4E:
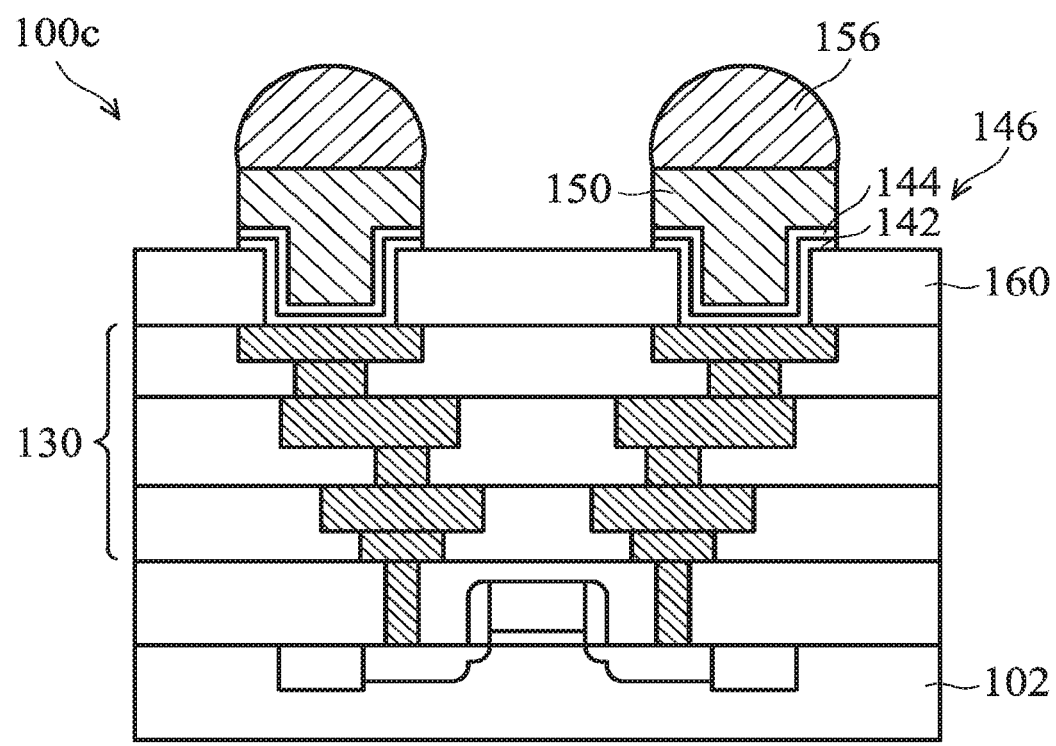

Afterwards, the conductive bump structure 156 is formed on the bonding layer 150. The conductive bump structure 156 is electrically connected to the bonding layer 150, as shown in FIG. 4E, in accordance with some embodiments of the disclosure.

It should be noted that anti-acid layer 146 and the bonding layer 150 are sequentially provided at the same CMP station. In other words, the deposition processes are performed in-situ without being transported to another station for convenience and efficiency.

It should be noted that in order to protect the underlying layers from being etched or removed, the thickness of the anti-acid layer 146 of the disclosure should be well controlled to equal to or greater than 140 nm. If the thickness of the anti-acid layer 146 is smaller than 140 nm, the underlying layer may be etched and delaminated easily.

Embodiments for forming a semiconductor device structure and method for formation the same are provided. A semiconductor device structure includes a substrate, and an interconnect structure formed over the substrate. An anti-acid layer formed over the interconnect structure. A bonding layer formed over the anti-acid layer and a number of pixel regions formed over a backside of the substrate or over the bonding layer. The anti-acid layer is configured to protect the underlying layers from being damaged by the acid solution which may be used in the subsequent process. In some embodiments, the anti-acid layer is formed in a passivation layer. In some embodiments, the anti-acid layer has a thickness that is greater than about 140 nm to effectively block the etching of the acid. Therefore, the reliability of the semiconductor device structure is improved.

In some embodiments, a complementary metal-oxide-semiconductor (CMOS) image sensor structure is provided. The CMOS image sensor structure includes a substrate having a frontside and a backside and an interconnect structure formed over the frontside of the substrate. The CMOS image sensor structure also includes an anti-acid layer formed over the interconnect structure and a bonding layer formed over the anti-acid layer. The CMOS image sensor structure further includes a number of pixel regions formed over the backside of the substrate or over the bonding layer.

In some embodiments, a semiconductor device structure is provided. The semiconductor device structure includes an interconnect structure formed over a substrate and a passivation layer formed over the interconnect structure. The semiconductor device structure also includes an anti-acid layer formed in the passivation layer and a bonding layer formed on the anti-acid layer and the passivation layer. The anti-acid layer has a thickness that is greater than about 140 nm.

In some embodiments, a method for forming a complementary metal-oxide-semiconductor (CMOS) image sensor structure is provided. The method includes providing a substrate having a frontside and a backside and forming an interconnect structure over the frontside of the substrate. The method also includes forming an anti-acid layer over the interconnect structure and forming a bonding layer over the anti-acid layer. The method further includes forming a plurality of pixels over the backside of the substrate or over the bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming the complementary metal-oxide-semiconductor (CMOS) image sensor structure, comprising:
   providing a substrate having a frontside and a backside;
   forming an interconnect structure over the frontside of the substrate;
   forming an anti-acid layer over the interconnect structure;
   forming a bonding layer over the anti-acid layer;
   providing a first conductive bump structure interfacing a first portion of the bonding layer and a second conductive bump structure interfacing a second portion of the bonding layer, wherein the anti-acid layer contiguously extends from under the first conductive bump structure to under the second conductive bump structure; and
   forming a plurality of pixels over the backside of the substrate or over the bonding layer.

2. The method for forming the CMOS image sensor device structure as claimed in claim 1, wherein forming the anti-acid layer and forming the bonding layer are performed in the same chamber.

3. The method for forming the CMOS image sensor device structure as claimed in claim 1, wherein forming the anti-acid layer over the interconnect structure comprises:
forming a metal nitride layer over the interconnect structure; and
forming a metal layer over the metal nitride layer.

4. The method for forming the CMOS image sensor device structure as claimed in claim 1, wherein forming the anti-acid layer over the interconnect structure comprises:
covering a top surface of the interconnect structure.

5. The method for forming the CMOS image sensor device structure as claimed in claim 1, wherein the forming the bonding layer includes forming a conductive layer including aluminum or copper.

6. The method for forming the CMOS image sensor device structure as claimed in claim 5, wherein the conductive layer directly interfaces a metal portion of the anti-acid layer.

7. A method for forming the complementary metal-oxide-semiconductor (CMOS) image sensor structure, comprising:
providing a substrate having a frontside and a backside;
forming an interconnect structure over the frontside of the substrate, wherein the interconnect structure has an upper surface providing a first portion of a metal layer, a dielectric layer extending between the first portion and a second portion of the metal layer;
forming an anti-acid layer over the interconnect structure, wherein the anti-acid layer physically interfaces the upper surface including the first portion of the metal layer, the second portion of the metal layer, and the dielectric layer extending between the first and second portions;
forming a bonding layer over the anti-acid layer; and
forming another feature over the bonding layer wherein the another feature is one of another substrate having another interconnect structure and a plurality of pixels disposed thereon or a conductive structure.

8. The method of claim 7, wherein the forming the anti-acid layer includes: a metal layer and a metal nitride layer.

9. The method of claim 8, wherein the metal nitride layer is tantalum nitride (TaN) and the metal layer is tantalum (Ta).

10. The method of claim 8, wherein the metal nitride layer is titanium nitride (TiN) and the metal layer is titanium (Ti).

11. The method of claim 7, wherein the forming the another feature includes
forming a bump structure over the bonding layer on the substrate.

12. The method of claim 11, wherein the bump structure is disposed in a passivation layer over the interconnect structure.

13. A method for forming a semiconductor device, comprising:
providing a substrate having a transistor and an interconnect structure disposed over substrate and interconnecting features of the transistor;
forming an anti-acid layer including a metal layer and a metal nitride layer over the interconnect structure, wherein the anti-acid layer contiguously extends from over a first metal feature of the interconnect structure to over a second metal feature of the interconnect structure, wherein the first metal feature and the second metal feature are coplanar;
forming a conductive bonding layer over the anti-acid layer;
forming a passivation layer with a conductive structure within the passivation layer; and
depositing a conductive bump over the conductive structure.

14. The method of claim 13, wherein the forming the anti-acid layer physically interfaces the first metal feature and the second metal feature and physically interfaces a dielectric material between the first metal feature and the second metal feature.

15. The method of claim 13, wherein the forming the anti-acid layer and the forming the conductive bonding layer are performed in-situ.

16. The method of claim 13, wherein the forming the anti-acid layer includes the metal nitride layer directly physically interfacing the first metal feature and the second metal feature.

17. The method of claim 16, wherein the forming the anti-acid layer includes forming the metal layer directly on the metal nitride layer.

\* \* \* \* \*